United States Patent
Panda et al.

(10) Patent No.: US 10,529,602 B1
(45) Date of Patent: Jan. 7, 2020

(54) METHOD AND APPARATUS FOR SUBSTRATE FABRICATION

(71) Applicant: APPLIED MATERIALS, INC., Santa Clara, CA (US)

(72) Inventors: Priyadarshi Panda, Newark, CA (US); Gill Lee, San Jose, CA (US); Srinivas Gandikota, Santa Clara, CA (US); Sung-Kwan Kang, San Jose, CA (US); Sanjay Natarajan, Portland, OR (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/189,487

(22) Filed: Nov. 13, 2018

(51) Int. Cl.
*H01L 21/67* (2006.01)

(52) U.S. Cl.
CPC .. *H01L 21/67184* (2013.01); *H01L 21/67155* (2013.01); *H01L 21/67161* (2013.01)

(58) Field of Classification Search
CPC ......... H01L 21/67184; H01L 21/67155; H01L 21/67161
See application file for complete search history.

(56) References Cited

U.S. PATENT DOCUMENTS

| | | | |
|---|---|---|---|
| 6,664,636 B2* | 12/2003 | Pyo | H01L 21/67167 257/762 |
| 6,803,272 B1 | 10/2004 | Halliyal et al. | |
| 6,824,825 B2* | 11/2004 | Otsuki | C23C 16/0218 427/255.38 |
| 8,309,374 B2* | 11/2012 | Porthouse | H01L 21/67069 414/217 |
| 9,960,045 B1 | 5/2018 | Purayath et al. | |
| 2004/0087163 A1 | 5/2004 | Steimle et al. | |
| 2007/0237608 A1* | 10/2007 | Jang | H01L 21/67161 414/217 |
| 2009/0046501 A1 | 2/2009 | Ranjan et al. | |
| 2010/0062603 A1 | 3/2010 | Ganguly et al. | |
| 2010/0178729 A1 | 7/2010 | Yoon et al. | |

* cited by examiner

*Primary Examiner* — William Coleman
(74) *Attorney, Agent, or Firm* — Moser Taboada; Alan Taboada

(57) ABSTRACT

Methods and apparatuses for substrate fabrication are provided herein. The apparatus, for example, can include a cluster tool including a vacuum transfer module (VTM) configured to receive, under vacuum conditions, a silicon substrate with a polysilicon plug (poly plug) and transfer, without vacuum break, the substrate to and from a plurality of processing chambers each independently connected to the VTM for performing a corresponding one of a plurality of DRAM bit line processes on the substrate, the plurality of processing chambers comprising a pre-cleaning chamber configured to remove native oxide from a surface of the substrate, a barrier metal deposition chamber configured to deposit the barrier metal on the surface of the poly plug on the silicon substrate, a barrier layer deposition chamber configured to deposit at least one material on the surface of the barrier metal, a bit line metal deposition chamber configured to deposit at least one material on the surface of the barrier layer, and a hard mask deposition chamber configured to deposit at least one material on the surface of the bit line metal.

20 Claims, 2 Drawing Sheets

METHOD AND APPARATUS FOR SUBSTRATE FABRICATION

FIELD

The disclosure generally relates to a method and an apparatus for substrate fabrication, and more particularly, to a cluster tool and methods used for dynamic random access memory (DRAM) bit line stack processes.

BACKGROUND

Conventional DRAM bit line stack processes use a plurality of different/independent tools to perform corresponding processes on a substrate (e.g., a wafer) having a polysilicon plug (poly plug), which was previously fabricated on the substrate. For example, processes that are, typically, performed on the substrate can include one or more types of pre-cleaning processes, barrier metal deposition, barrier layer deposition, bit line metal deposition, hard mask deposition, etc.

The inventors have observed that oxidation on the deposited films, which can be caused by exposing the substrate to atmospheric pressure conditions, can occur post poly plug fabrication, and can continue to occur after each subsequent process is performed on the substrate, e.g., poly plug to barrier metal deposition, barrier metal deposition to barrier layer deposition, barrier layer deposition to bit line metal deposition, and so on. The oxidation can lead to resistance drawbacks on the substrate (i.e., lack of ohmic contact), and material property degradation of the substrate.

Therefore, the inventors have provided improved methods and apparatus for processing a substrate useful, for example, for DRAM bit line stack processes.

SUMMARY

Methods and apparatus for substrate fabrication are provided herein. In accordance with an aspect of the disclosure, there is provided a cluster tool for performing DRAM bit line stack processes post poly plug fabrication on a substrate. In some embodiments, the cluster tool includes: a front-end module, a vacuum transfer module (VTM), and a plurality of processing chambers each independently connected to the VTM for receiving the substrate and for performing a corresponding one of a plurality of DRAM bit line processes on the substrate.

In accordance with an aspect of the disclosure, there is provided a method for performing DRAM bit line stack processes post poly plug fabrication on a substrate. In some embodiments, the method includes: loading the substrate into a front-end module of a cluster tool and transferring the substrate from the front-end module to at least one of a plurality of processing chambers using a VTM of the cluster tool and performing at least one of a plurality of DRAM bit line processes on the substrate.

In accordance with an aspect of the disclosure, there is provided a nontransitory computer readable storage medium having stored thereon a plurality of instructions that when executed by a processor perform a method for performing DRAM bit line stack processes post poly plug fabrication on a substrate. In some embodiments, the method includes: loading the substrate into a front-end module of a cluster tool and transferring the substrate from the front-end module to at least one of a plurality of processing chambers using a VTM of the cluster tool and performing at least one of a plurality of DRAM bit line processes on the substrate.

Other and further embodiments of the disclosure are described below.

BRIEF DESCRIPTION OF THE DRAWINGS

Embodiments of the disclosure, briefly summarized above and discussed in greater detail below, can be understood by reference to the illustrative embodiments of the disclosure depicted in the appended drawings, in which.

Figure 3:
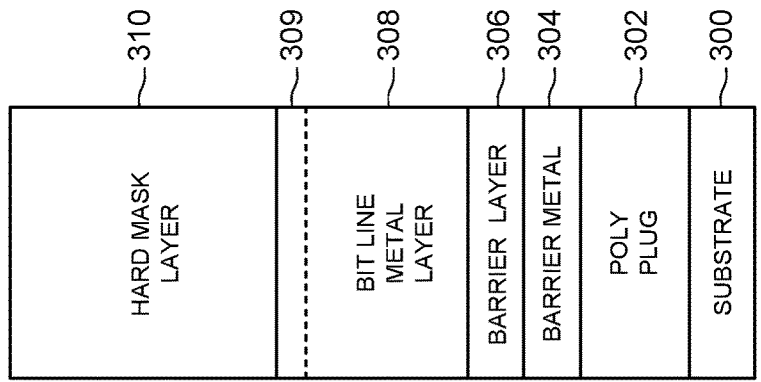
FIG. 3 is a diagram of a substrate, in accordance with at least some embodiments of the disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Figure 1:
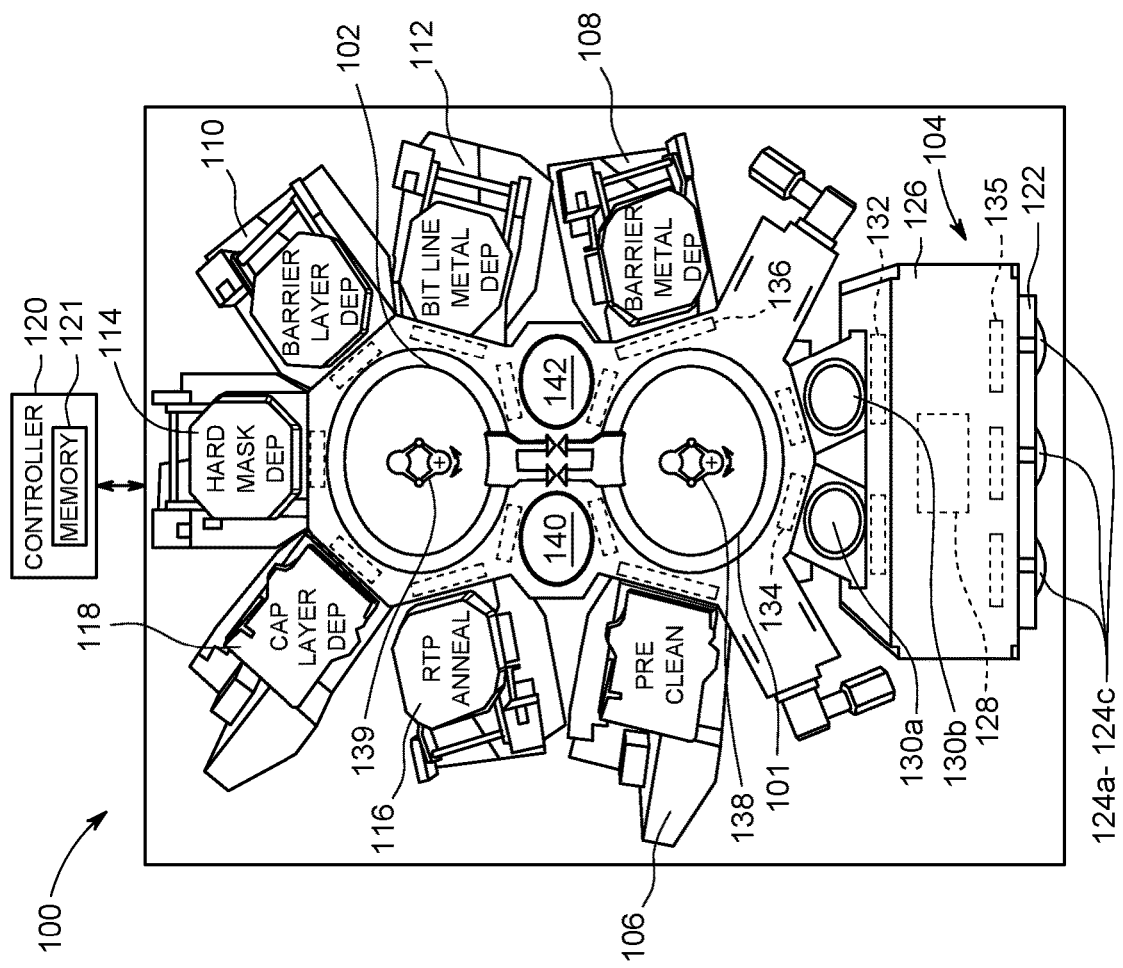
FIG. 1 is a diagram of a cluster tool, in accordance with at least some embodiments of the disclosure.

Methods and apparatuses for substrate fabrication are described herein. More particularly, FIG. 1 is a diagram of a cluster tool 100 that is configured for substrate fabrication, e.g., post poly plug fabrication, in accordance with at least some embodiments of the disclosure. The cluster tool 100 includes one or more vacuum transfer modules (VTM; VTM 101 and VTM 102 shown in FIG. 1), a front-end module 104, a plurality of processing chambers/modules 106, 108, 110, 112, 114, 116, and 118, and a process controller 120 (controller 120). In embodiments with more than one VTM, such as is shown in FIG. 1, one or more pass-through chambers may be provided to facilitate vacuum transfer from one VTM to another VTM. In embodiments consistent with that shown in FIG. 1, two pass-through chambers can be provided (e.g., pass-through chamber 140 and pass-through chamber 142). A non-limiting example of cluster tools suitable for modification in accordance with the present disclosure include the ENDURA® line of processing tools, commercially available from Applied Materials, Inc., of Santa Clara, Calif.

The front-end module 104 includes a loading port 122 that is configured to receive one or more substrates, for example from a FOUP (front opening unified pod) or other suitable substrate containing box or carrier, that are to be processed using the cluster tool 100. The loading port 122 can include three loading areas 124a-124c, which can be used for loading one or more substrates. However, greater or fewer loading areas can be used. For illustrative purposes, FIG. 3 shows a schematic side view of a portion of a substrate 300 having a poly plug 302, e.g., processed outside of the cluster tool 100, and a plurality of additional layers, as described below, fabricated within the cluster tool 100.

The front-end module 104 includes an atmospheric transfer module (ATM) 126 that is used to transfer a substrate that has been loaded into the loading port 122. More particularly, the ATM 126 includes one or more robot arms 128 (shown in phantom) that are configured to transfer the substrate from the loading areas 124a-124c to the ATM 126, through doors 135 (shown in phantom) that connects the ATM 126 to the loading port 122. There is typically one door for each loading port (124a-124c) to allow substrate transfer from respective loading port to the ATM 126. The robot arm 128 is also configured to transfer the substrate from the ATM 126 to airlocks 130*a*, 130*b* through doors 132 (shown in phantom, one each for each air lock) that connect the ATM 126 to the air locks 130*a*, 130*b*. The number of airlocks can be more or less than two but for illustration purposes only, two airlocks (130*a* and 130*b*) are shown with each airlock having a door to connect it to the ATM 126.

The air locks 130*a*, 130*b*, under the control of the controller 120, can be maintained at either an atmospheric pressure environment or a vacuum pressure environment, and serve as an intermediary or temporary holding space for a substrate that is being transferred to/from the VTM 101, 102. The VTM 101 includes a robot arm 138 (shown in phantom) that is configured to transfer the substrate from the air locks 130*a*, 130*b* to one or more of the plurality of processing chambers 106, 108, or to one or more pass-through chambers 140 and 142, without vacuum break, i.e., while maintaining a vacuum pressure environment within the VTM 102 and the plurality of processing chambers 106, 108 and pass-through chambers 140 and 142. The VTM 102 includes a robot arm 138 (in phantom) that is configured to transfer the substrate from the air locks 130*a*, 130*b* to one or more of the plurality of processing chambers 106, 108, 110, 112, 114, 116, and 118, without vacuum break, i.e., while maintaining a vacuum pressure environment within the VTM 102 and the plurality of processing chambers 106, 108, 110, 112, 114, 116, and 118.

In certain embodiments, the air locks 130*a*, 130*b* can be omitted, and the controller 120 can be configured to move the substrate directly from the ATM 126 to the VTM 102.

A door 134, e.g., a slit valve door, connects each respective air lock 130*a*, 130*b*, to the VTM 101. Similarly, a door 136, e.g., a slit valve door, connects each processing module to the VTM to which the respective processing module is coupled (e.g., either the VTM 101 or the VTM 102). The plurality of processing chambers 106, 108, 110, 112, 114, 116, and 118 are configured to perform one or more processes that are typically associated with the substrate post poly plug fabrication as described herein.

The controller 120 controls the overall operations of the cluster tool 100 and includes a memory 121 to store data or commands/instructions related to the operation of the cluster tool 100. For example, the controller 120 controls the robot arms 128, 138, 139 of the ATM 126, VTM 101, VTM 102, respectively, for transferring the substrate to/from the VTM 101 and between the VTM 101 and the VTM 102. The controller 120 controls opening and closing of the doors 132, 134, 136, and controls the pressure of the air locks 130*a*, 130*b*, e.g., maintaining either atmospheric pressure/vacuum pressure environments within the air locks 130*a*, 130*b* as desired for substrate transfer processes. The controller 120 also controls operation of the individual processing chambers 106, 108, 110, 112, 114, 116, and 118 for performing the operations associated therewith, as described in greater detail below.

Figure 2:
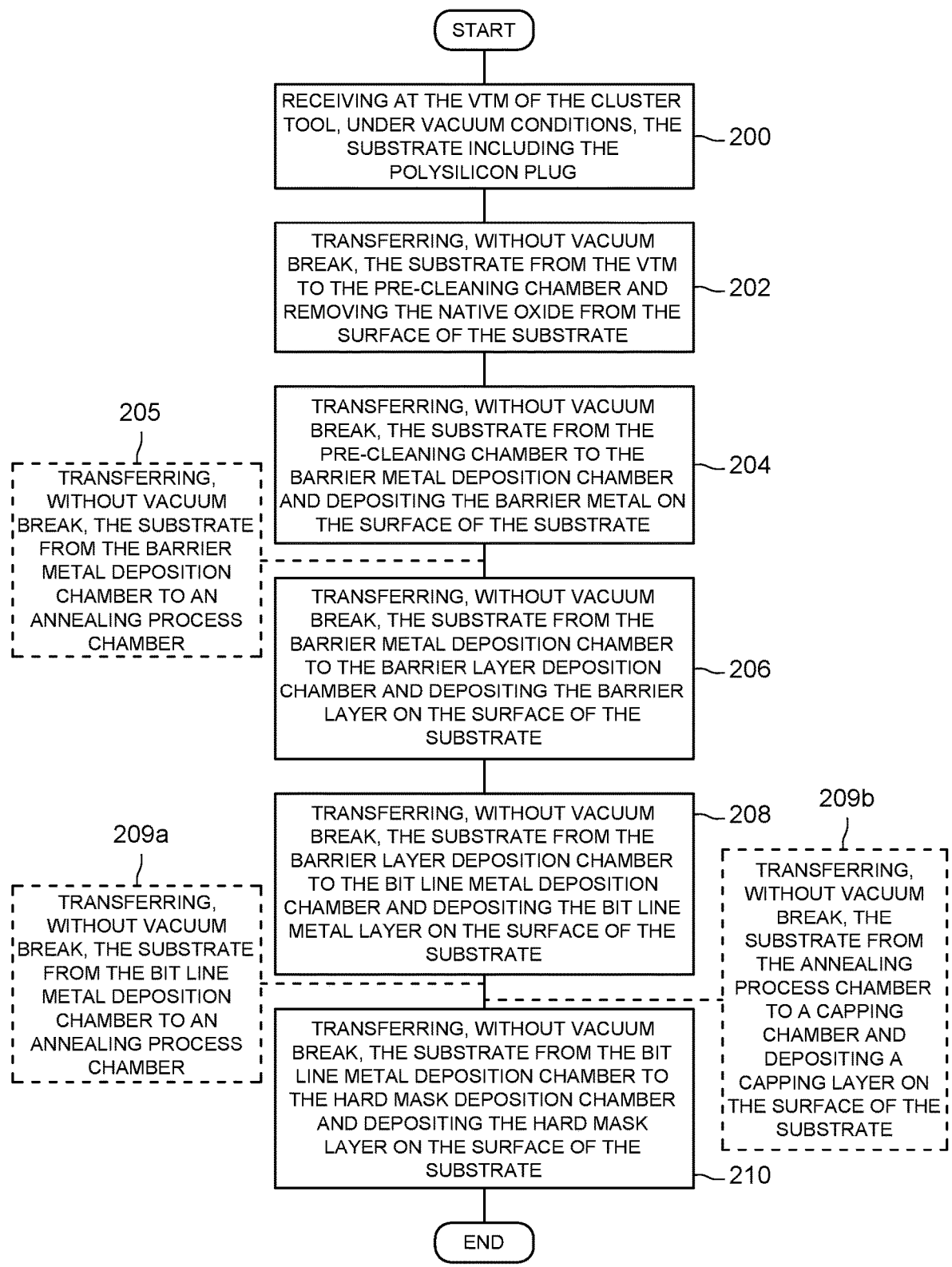
FIG. 2 is a flowchart of a method for substrate fabrication, in accordance with at least some embodiments of the disclosure.

FIG. 2 is a method for performing one or more DRAM bit line stack processes, post poly plug fabrication, using the cluster tool 100. For illustrative purposes, FIG. 3 shows a schematic side view of a portion of the substrate 300 including the poly plug 302, e.g., after the poly plug 302 has been formed on the substrate 300 outside of the cluster tool 100. Prior to performing the method of FIG. 2, the substrate 300 can be loaded into the loading port 122, via one or more of the loading areas 124*a*-124*c*. The robot arm 128 of the ATM 126, under control of the controller 120, can transfer the substrate 300 having the poly plug 302 from the loading area 124*a* to the ATM 126.

The controller 120 can determine if at least one of the air locks 130*a*, 130*b* is at an atmospheric pressure environment, depending on if one or both air locks 130*a*, 130*b* is/are being used. For illustrative purposes, it is assumed that only the air lock 130*a* is being used. If the controller 120 determines that the air lock 130*a* is at an atmospheric pressure environment, at the controller 120 can open the door (part of 132) that connects the ATM 126 to the air lock 130*a*. Conversely, if the controller 120 determines that the air lock 130*a* is not at an atmospheric pressure environment, the controller 120 can adjust the pressure within the air lock 130*a* to an atmospheric pressure environment (e.g., via a pressure control valve that is operably connected to the air locks 130*a*, 130*b* and controlled by the controller 120), and can recheck the pressure within the air lock 130*a*.

The controller can instruct the robot arm 128 to transfer the substrate 300 from the ATM 126 to the air lock 130*a*, close the door 132, and adjust the pressure within the air lock 130*a* to a vacuum pressure environment, for example, matching or substantially matching the vacuum pressure environment inside of the VTM 101.

The controller 120 can determine if the air lock 130*a* is at a vacuum pressure environment. If the controller 120 determines that the air lock 130*a* is at a vacuum pressure environment, the controller can open the door 134 that connects the VTM 101 to the air lock 130*a*. Conversely, if the controller 120 determines that the air lock 130*a* is not at a vacuum pressure environment, the controller 120 can adjust the pressure within the air lock 130*a* to a vacuum pressure environment (e.g., via the pressure control valve that is operably connected to the air locks 130*a*, 130*b* and controlled by the controller 120), and recheck the pressure within the air lock 130*a*.

At 200, the controller 120 instructs the robot arm 138 to transfer the substrate 300 from the air lock 130*a* through the door 134 to the VTM 101 and closes the door 134. Alternatively, the door 134 can be left open, for example, to receive an outbound substrate upon completion of processing within the cluster tool 100.

At 202, the controller 120 instructs the robot arm 138 to transfer the substrate 300 to one or more of the processing chambers so that fabrication of the substrate can be completed—i.e., completion of the bit line stack processes atop the poly plug 302 on the substrate 300. For example, at 202 the controller 120 can instruct the robot arm 138 to open the door 136 corresponding to the processing chamber 106. Once opened, the controller 120 can instruct the robot arm 138 to transfer (without vacuum break, i.e., the vacuum pressure environment is maintained within the VTM 101 and the VTM 102 while the substrate 300 is transferred between the processing chambers 106, 108, 110, 112, and 114) the substrate 300 to a pre-cleaning chamber (e.g., processing chamber 106). The processing chamber 106, can be used to perform one or more pre-cleaning process to remove contaminants that may be present on the substrate 300, e.g., native oxidation that can be present on the substrate 300. One such pre-cleaning chamber is the SiCoNi™ processing tool commercially available from Applied Materials, Inc. of Santa Clara, Calif.

Next, at 204 the controller 120 opens the door 136 and instructs the robot arm 138 to transfer the substrate 300 to the next processing chamber. For example, at 204 the controller 120 can instruct the robot arm 138 to transfer, without vacuum break, the substrate 300 from the pre-cleaning chamber to a barrier metal deposition chamber. For example, the controller 120 can instruct the robot arm 138 to transfer the substrate under vacuum from the processing chamber 106 to, for example, the processing chamber 108. The processing chamber 108 is configured to perform a barrier metal deposition process on the substrate 300 (e.g., to deposit a barrier metal 304 atop the cleaned substrate 300 and the poly plug 302). The barrier metal can be one of titanium (Ti) or tantalum (Ta).

Next, at 206 the controller 120 can instruct the robot arm 138 to transfer, without vacuum break, the substrate 300 from the barrier metal deposition chamber to a barrier layer deposition chamber. For example, the controller 120 can instruct the robot arm 138 to transfer the substrate under vacuum from the processing chamber 108 to either of the pass through chambers 140, 142, at which point the robot arm 139 inside the VTM 102 can pick up the substrate 300 and move it to, for example, the processing chamber 110. The processing chamber 110 is configured to perform a barrier layer deposition process on the substrate 300 (e.g., to deposit a barrier layer 306 atop the barrier metal 304). The barrier layer can be one of titanium nitride (TiN), tantalum nitride (TaN), or tungsten nitride (WN).

Next, at 208 the controller 120 can instruct the robot arm 139 to transfer, without vacuum break, the substrate 300 from the processing chamber 110 to, for example, the processing chamber 112. The processing chamber 112 is configured to perform a bit line metal deposition process on the substrate 300 (e.g., to deposit a bit line metal layer 308 atop the barrier layer 306 deposited at 206)). The bit line metal can be one of tungsten (W), molybdenum (Mo), ruthenium (Ru), iridium (Ir), or rhodium (Rh).

Next, at 210 the controller 120 can instruct the robot arm 139 to transfer, without vacuum break, the substrate 300 from the processing chamber 112 to, for example, the processing chamber 114. The processing chamber 114 is configured to perform a hard mask deposition process on the substrate 300 (e.g., to deposit a hard mask layer 310 atop the bit line metal layer 308 deposited at 208). The hard mask can be one of silicon nitride (SiN), silicon oxide (SiO), or silicon carbide (SiC).

In some embodiments, an annealing process can be performed on the substrate 300 after deposition of the barrier layer 306 and prior to depositing the bit line metal layer 308 atop the barrier layer 306, as shown at 205. The annealing process can be any suitable annealing process, such as a rapid thermal processing (RTP) anneal. For example, prior to transferring the substrate 300 from the processing chamber 108 to the processing chamber 110, the substrate 300 can be first transferred to the processing chamber 116. The processing chamber 116 is configured to perform an annealing process on the substrate 300. Subsequent to the anneal process, the annealed substrate 300 including the barrier layer 306 can be transferred under vacuum from the annealing chamber (e.g., processing chamber 116) to the barrier layer deposition chamber (e.g., processing chamber 110), e.g., using the robot arm 139.

Alternatively or in combination, an annealing process can be performed on the substrate 300 after deposition of the bit line metal layer 308 and prior to depositing the hard mask layer 310 atop the bit line metal layer 308, as shown at 209a. For example, prior to transferring the substrate 300 from the processing chamber 112 to the processing chamber 114, the substrate 300 can be first transferred to the processing chamber 116 (i.e., an annealing chamber). An annealing process, or another annealing process if the anneal at 205 has been previously performed, can be performed on the substrate 300 having the bit line metal layer 308 deposited thereon as discussed above. In some embodiments where the annealing process is performed at 209a, the annealed substrate 300 can be transferred to another processing chamber to have an optional capping layer 309 deposited on the bit line metal layer 308, as shown at 209b. For example, the annealed substrate 300 including the bit line metal layer 308 can be transferred under vacuum from the annealing chamber (e.g., processing chamber 116) to a capping layer deposition chamber (e.g., processing chamber 118), e.g., using the robot arm 139 to deposit a capping layer atop the annealed bit line metal layer 308.

In some embodiments, after the bit line metal is deposited, some metals such as ruthenium (Ru) are grain growth materials. The inventors have observed that subsequent deposition of the hard mask layer atop such bit line metals at high temperatures will undesirably cause poor surface roughness. The inventors have discovered that annealing the bit line metal layer prior to deposition of the hard mask layer post deposition of a low temperature cap layer can advantageously improve the surface roughness of the bit line metal layer. By performing each of the above sequences in an integrated tool (e.g., the cluster tool 100), oxidation of the bit line metal during anneal for grain growth is further advantageously avoided.

Additional processes not herein described can also be performed on the substrate 300, or some of the processes described herein can be omitted.

After the above described processes associated with the processing chambers 108, 110, 112, and 114 (and chambers 116, 118 if used) have been performed on the substrate 300, the substrate 300 is transferred from the VTM 102 back to the loading port 122, e.g., using the robot arm 139 in the VTM 102 to transfer the substrate 300 to a pass-through chamber 140, 142, and using the robot arm 138 in the VTM 101 to transfer the substrate 300 from the pass-through chamber 140, 142 to one of the air locks 130a, 130b. The robot arm 128 can then be used to return the substrate 300 to an empty slot in the FOUP in the loading port 122.

The cluster tool 100 and methods of use described herein advantageously allow a user to perform a plurality of DRAM bit line processes on a poly plug using a single machine that is configured to maintain a vacuum pressure environment throughout the entire DRAM bit line process. Accordingly, the likelihood of oxidation occurring on the substrate during post substrate 300 fabrication is reduced, if not eliminated. Additionally, since the vacuum pressure environment is maintained throughout the entire DRAM bit line process, the choice of bit line metal materials is not limited by the grain growth characteristics of the metal.

While the foregoing is directed to embodiments of the present disclosure, other and further embodiments of the disclosure may be devised without departing from the basic scope thereof.

What is claimed is:

1. A cluster tool for performing dynamic random access memory (DRAM) bit line stack processes, the cluster tool comprising:
   a vacuum transfer module (VTM) configured to receive, under vacuum conditions, a substrate having a polysilicon plug formed thereon and to transfer, without vacuum break, the substrate to and from a plurality of processing chambers each independently connected to the VTM for performing a corresponding one of a plurality of DRAM bit line processes on the substrate, the plurality of processing chambers comprising:
   a pre-cleaning chamber configured to remove native oxide from a surface of the substrate;

a barrier metal deposition chamber configured to deposit a barrier metal on the surface of the substrate;
a barrier layer deposition chamber configured to deposit a barrier layer on the surface of the substrate;
a bit line metal deposition chamber configured to deposit a bit line metal layer on the surface of the substrate; and
a hard mask deposition chamber configured to deposit a hard mask layer on the surface of the substrate.

2. The cluster tool of claim 1, wherein the plurality of processing chambers further comprises:
an annealing chamber configured to perform an annealing process on the substrate; and
a capping chamber configured to deposit a capping layer on the surface of the substrate.

3. The cluster tool of claim 1, wherein the barrier metal that the barrier metal deposition chamber is configured to deposit includes at least one of titanium (Ti) or tantalum (Ta).

4. The cluster tool of claim 1, wherein the barrier layer that the barrier metal deposition chamber is configured to deposit includes at least one of titanium nitride (TiN), tantalum nitride (TaN), or tungsten nitride (WN).

5. The cluster tool of claim 1, wherein the bit line metal layer that the bit line metal deposition chamber is configured to deposit includes at least one of tungsten (W), molybdenum (Mo), ruthenium (Ru), iridium (Ir) or rhodium (Rh).

6. The cluster tool of claim 1, wherein the hard mask layer that the hard mask deposition chamber is configured to deposit includes at least one of silicon nitride (SiN), silicon oxide (SiO), or silicon carbide (SiC).

7. The cluster tool of claim 1, wherein the cluster tool further comprises a controller configured to control the plurality of processing chambers.

8. The cluster tool of claim 7, wherein the controller comprises a nontransitory computer readable storage medium having stored thereon a plurality of instructions that when executed by the controller perform a method for performing the DRAM bit line stack processes, the method comprising:
receiving at the VTM of the cluster tool, under vacuum conditions, the silicon substrate with the polysilicon plug;
transferring, without vacuum break, the substrate from the VTM to the pre-cleaning chamber and removing the native oxide from the surface of the polysilicon plug;
transferring, without vacuum break, the substrate from the pre-cleaning chamber to the barrier metal deposition chamber and depositing the barrier metal on the poly plug;
transferring, without vacuum break, the substrate from the barrier metal deposition chamber to the barrier layer deposition chamber and depositing the barrier layer on the barrier metal;
transferring, without vacuum break, the substrate from the barrier layer deposition chamber to the bit line metal deposition chamber and depositing the bit line metal layer on the barrier layer; and
transferring, without vacuum break, the substrate from the bit line metal deposition chamber to the hard mask deposition chamber and depositing the hard mask layer on the bit line metal layer.

9. A method for performing dynamic random access memory (DRAM) bit line stack processes, the method comprising:
receiving in a vacuum transfer module (VTM) of a cluster tool, under vacuum conditions, a substrate having a polysilicon plug;
transferring, without vacuum break, the substrate from the VTM to a pre-cleaning chamber for removing a native oxide from a surface of the poly plug on the substrate;
transferring, without vacuum break, the substrate from the pre-cleaning chamber to a barrier metal deposition chamber and depositing a barrier metal on the poly plug;
transferring, without vacuum break, the substrate from the barrier metal deposition chamber to a barrier layer deposition chamber and depositing a barrier layer on the barrier metal;
transferring, without vacuum break, the substrate from the barrier layer deposition chamber to a bit line metal deposition chamber and depositing a bit line metal layer on the barrier layer; and
transferring, without vacuum break, the substrate from the bit line metal deposition chamber to a hard mask deposition chamber and depositing a hard mask layer on the bit line metal layer.

10. The method of claim 9, further comprising, prior to transferring, without vacuum break, the substrate from the barrier metal deposition chamber to the barrier layer deposition chamber, transferring, without vacuum break, the substrate from the barrier metal deposition chamber to an annealing process chamber and performing an annealing process on the substrate.

11. The method of claim 9, further comprising, prior to transferring, without vacuum break, the substrate from the bit line metal deposition chamber to the hard mask deposition chamber:
transferring, without vacuum break, the substrate from the bit line metal deposition chamber to an annealing process chamber and performing an annealing process on the substrate; and
transferring, without vacuum break, the substrate from the annealing process chamber to a capping chamber and depositing a capping layer on the bit line metal layer.

12. The method of claim 9, wherein the barrier metal layer that the barrier metal deposition chamber deposits includes at least one of titanium (Ti) or tantalum (Ta).

13. The method of claim 9, wherein the barrier layer that the barrier layer deposition chamber deposits includes at least one of titanium nitride (TiN), tantalum nitride (TaN), or tungsten nitride (WN).

14. The method of claim 9, wherein the bit line metal layer that the bit line metal deposition chamber deposits includes at least one of tungsten (W), molybdenum (Mo), ruthenium (Ru), iridium (Ir), or rhodium (Rh).

15. The method of claim 9, wherein the hard mask layer that the hard mask deposition chamber deposits includes at least one of silicon nitride (SiN), silicon oxide (SiO), or silicon carbide (SiC).

16. The method of claim 9, wherein transferring the substrate to and from the pre-cleaning chamber, barrier metal deposition chamber, barrier layer deposition chamber, bit line metal deposition chamber, and hard mask deposition chamber is controlled using a controller of the cluster tool.

17. The method of claim 16, wherein the VTM comprises at least one air lock and a robot arm and receiving the substrate at the VTM comprises transferring using the robot arm the substrate from the at least one air lock to the VTM, without vacuum break.

18. A nontransitory computer readable storage medium having stored thereon a plurality of instructions that when executed by a processor perform a method for performing dynamic random access memory (DRAM) bit line stack processes, the method comprising:
  receiving at a vacuum transfer module (VTM) of a cluster tool, under vacuum conditions, a substrate including with a polysilicon plug;
  transferring, without vacuum break, the substrate from the VTM to a pre-cleaning chamber and removing native oxide from a surface of the substrate;
  transferring, without vacuum break, the substrate from the pre-cleaning chamber to a barrier metal deposition chamber and depositing barrier metal on the poly plug;
  transferring, without vacuum break, the substrate from the barrier metal deposition chamber to a barrier layer deposition chamber and depositing a barrier layer on the barrier metal;
  transferring, without vacuum break, the substrate from the barrier layer deposition chamber to a bit line metal deposition chamber and depositing a bit line metal layer on the barrier layer; and
  transferring, without vacuum break, the substrate from the bit line metal deposition chamber to a hard mask deposition chamber and depositing a hard mask layer on the surface of the bit line metal.

19. The nontransitory computer readable storage medium of claim 18, wherein the barrier metal that the barrier metal deposition chamber deposits at least one of titanium (Ti) or tantalum (Ta),
  wherein the barrier layer that the bit line metal deposition chamber deposits includes at least one of titanium nitride (TiN) or tantalum nitride (TaN) or tungsten nitride (WN),
  wherein the bit line metal layer that the bit line metal deposition chamber deposits includes at least one of tungsten (W), molybdenum (Mo), ruthenium (Ru), iridium (Ir) or rhodium (Rh), and
  wherein the hard mask layer that the hard mask deposition chamber deposits includes at least one of silicon nitride (SiN), silicon oxide (SiO) or silicon carbide (SiC).

20. The nontransitory computer readable storage medium of claim 18, further comprising at least one of:
  prior to transferring the substrate from the barrier metal deposition chamber to the barrier layer deposition chamber, transferring, without vacuum break, the substrate from the barrier metal deposition chamber to an annealing process chamber and performing an annealing process on the substrate; or
  prior to transferring the substrate from the bit line metal deposition chamber to the hard mask deposition chamber, transferring, without vacuum break, the substrate from the bit line metal deposition chamber to an annealing process chamber and performing an annealing process on the substrate; and transferring, without vacuum break, the substrate from the annealing process chamber to a capping chamber and depositing a capping layer on the surface of the substrate.

* * * * *